(12) United States Patent
Wyland (10) Patent No.: US 7,872,352 B2
(45) Date of Patent: Jan. 18, 2011

(54) CARBON NANOTUBE BOND PAD STRUCTURE AND METHOD THEREFOR

(75) Inventor: Chris Wyland, Livermore, CA (US)

(73) Assignee: Taiwan Semiconductor Manufacturing Company, Ltd., Hsin-chu (TW)

(*) Notice: Subject to any disclaimer, the term of this patent is extended or adjusted under 35 U.S.C. 154(b) by 380 days.

(21) Appl. No.: 11/910,046

(22) PCT Filed: Mar. 27, 2006

(86) PCT No.: PCT/IB2006/050929

§ 371 (c)(1),
(2), (4) Date: Apr. 30, 2008

(87) PCT Pub. No.: WO2006/103620

PCT Pub. Date: Oct. 5, 2006

(65) Prior Publication Data

US 2008/0211112 A1   Sep. 4, 2008

Related U.S. Application Data

(60) Provisional application No. 60/666,038, filed on Mar. 28, 2005.

(51) Int. Cl.
*H01L 23/48* (2006.01)
*H01L 23/52* (2006.01)

(52) U.S. Cl. ............... 257/758; 257/774; 257/E23.165; 977/742; 977/932

(58) Field of Classification Search ............... 257/758, 257/774, E23.165; 977/742, 932
See application file for complete search history.

(56) References Cited

U.S. PATENT DOCUMENTS 5,287,002 A   2/1994   Freeman, Jr. et al.

(Continued)

FOREIGN PATENT DOCUMENTS

WO   0157917 A2   8/2001

(Continued)

OTHER PUBLICATIONS

International Bureau of WIPO—European Patent Office (Search Authority), PCT International Preliminary Report on Patentability—Written Opinion of the International Searching Authority, Sep. 28, 2007, 6 pages, International Application No. PCT/IB2006/050929, Munich.

(Continued)

*Primary Examiner*—Nitin Parekh
(74) *Attorney, Agent, or Firm*—Haynes and Boone, LLP (57) ABSTRACT

A bond pad structure (300) for an integrated circuit (IC) device uses carbon nanotubes to increase the strength and resilience of wire bonds (360). In an example embodiment there is, a bond pad structure (300) on an IC substrate, the bond pad structure comprises, a first conductive layer (310) having a top surface and a bottom surface, the bottom surface attached to the IC substrate. A dielectric layer (320) is deposited on the top surface of the first conductive layer (310), the dielectric layer having an array of vias (325), the array of vias filled with a carbon nanotube material (325), the carbon nanotube material (325) is electrically coupled to the first conductive layer (310). There is a second conductive layer (330) having a top surface and a bottom surface, the bottom surface of the second conductive layer is electrically coupled to the carbon nanotube material (325). A feature of this embodiment may include the first (410,510) or second (430, 530) conductive layer being comprised of carbon nanotube material, as well.

12 Claims, 7 Drawing Sheets

U.S. PATENT DOCUMENTS

| | | | |
|---|---|---|---|
| 6,146,227 A * | 11/2000 | Mancevski | 445/24 |
| 6,837,928 B1 | 1/2005 | Zhang et al. | |
| 6,855,603 B2 * | 2/2005 | Choi et al. | 438/268 |
| 7,135,773 B2 * | 11/2006 | Furukawa et al. | 257/758 |
| 7,229,909 B2 * | 6/2007 | Furukawa et al. | 438/622 |
| 7,335,603 B2 * | 2/2008 | Mancevski | 438/758 |
| 7,348,675 B2 * | 3/2008 | Dubin et al. | 257/774 |
| 7,679,180 B2 | 3/2010 | Tsao et al. | |
| 2001/0023986 A1 * | 9/2001 | Mancevski | 257/741 |
| 2003/0211724 A1 | 11/2003 | Haase | |
| 2004/0169281 A1 * | 9/2004 | Nguyen et al. | 257/758 |
| 2004/0253805 A1 | 12/2004 | Dubin et al. | |
| 2005/0110145 A1 * | 5/2005 | Elers | 257/758 |
| 2005/0196950 A1 * | 9/2005 | Steinhogl et al. | 438/622 |
| 2005/0215049 A1 * | 9/2005 | Horibe et al. | 438/622 |
| 2006/0180941 A1 * | 8/2006 | Kirby et al. | 257/774 |

FOREIGN PATENT DOCUMENTS

| | | |
|---|---|---|
| WO | WO-2004/075288 | 9/2004 |

OTHER PUBLICATIONS

European Patent Office, Communication Pursuant to Article 94(3) EPC, Feb. 5, 2009, 2 pages, Application No. 06727747.5-2203, Munich.

European Patent Office, Office action dated Jun. 7, 2010, Application No. 06727747.5-2203/1866962, 4 pages.

Ngo, Quoc, et al., Electron Transport Through Metal-Multiwall Carbon Nanotube Interfaces, IEEE Transactions on Nanotechnology, vol. 3, No. 2, Jun. 2004, 7 pages.

Kreupl, F., et al., "Carbon Nanotubes in Interconnect Applications," Microelectronic Engineering 64 (2002) 399-408, Elsevier Science B.V., PII: S0167-9317(02) 00814-6, 10 pages.

* cited by examiner

CARBON NANOTUBE BOND PAD STRUCTURE AND METHOD THEREFOR

The invention relates to integrated circuit (IC) packaging. More particularly this invention relates to wire bonding of a semiconductor substrate to a package and enhancing the mechanical strength of the wire bond and substrate bond pad interface.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged. The devices are bonded to the user-specified package. Connections are made to bonding pads on the semiconductor die with bond wires which in turn, connect the device die to external package pins.

Wire bonding is a solid phase welding process, where the two metallic materials (wire and pad surface) are brought into intimate contact. Once the surfaces are in intimate contact, electron sharing or inter-diffusion of atoms takes place, resulting in the formation of wire bond. In wire bonding process, bonding force can lead to material deformation, breaking up contamination layer and smoothing out surface asperity, which can be enhanced by the application of ultrasonic energy. Heat can accelerate inter-atomic diffusion, thus the bond formation. Bonds made have to be sufficiently strong to resist forces that may be encountered during use of the circuit. With a "bond-pull" tester, the strength of the bond may be measured. Those bonds showing insufficient strength may be screened out with such apparatus. Table 1 depicts specified pull forces dependent on bond wire diameter.

TABLE 1

| Bond Wire Pull Requirements | |
| --- | --- |
| Bond Wire Diameter | Pull Strength |
| 20 um | (Wire length = 3 mm) 2.0 g; (Wire length <3 mm) 2.5 g |
| 23/25 um | 3.0 g |
| 30/32 um | 4.0 g |
| 33/38 um | 5.0 g |
| 50 um | 7.5 g |

Figure 1A:
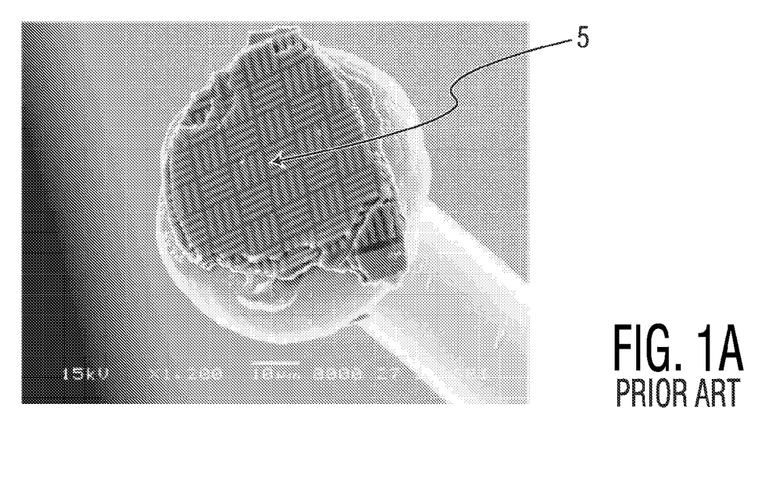
FIGS. 1A-1C (Prior Art) depicts an example bond pad structure with bond wire lifted off.
Figure 1B:
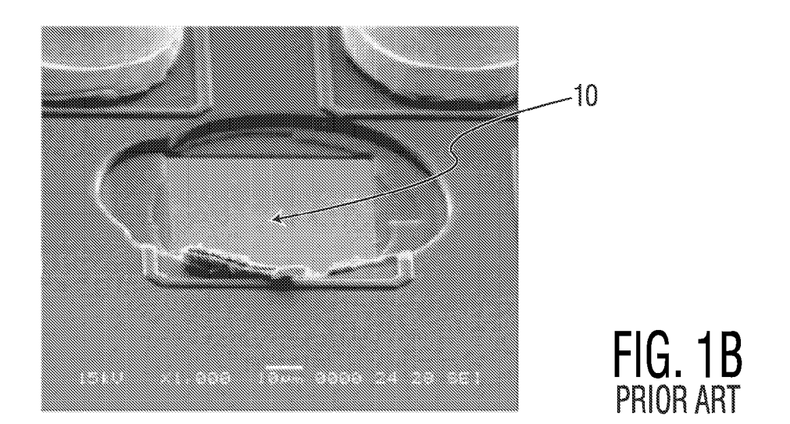
Figure 1C:
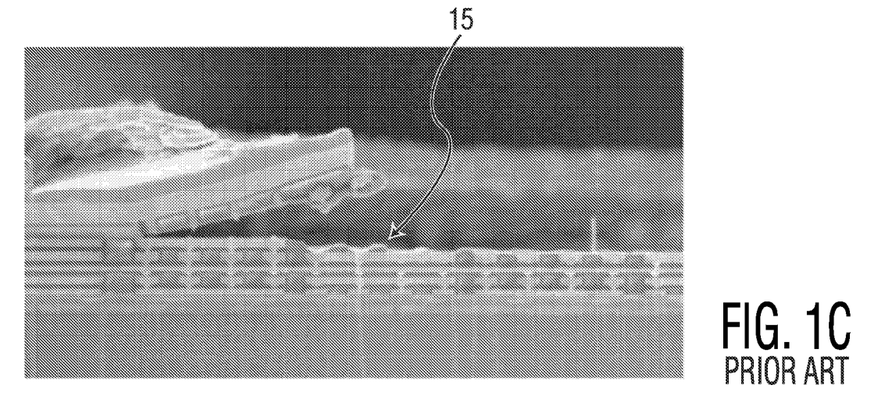

Refer to FIGS. 1A-1C. The bond wire 5 has lifted off the bond pad 10. Furthermore, surrounding material 15 has been deformed.

During the wire bonding process, the forces required for performing the weld may exceed the compressive strength of the bond pad and underlying structure. One approach is to form arrays of dielectric pads within the metal region defined by the bond pad. In multilevel metal devices, these are arrays of vias in which inter-level metal is deposited to connect multiple layers of metallization. A via array is an arrangement of contact holes within a dielectric layer that enable the connection of one or more conductive layers to one another through the filling of the contact holes with a suitable conductive material, usually metallization.

Figure 2:
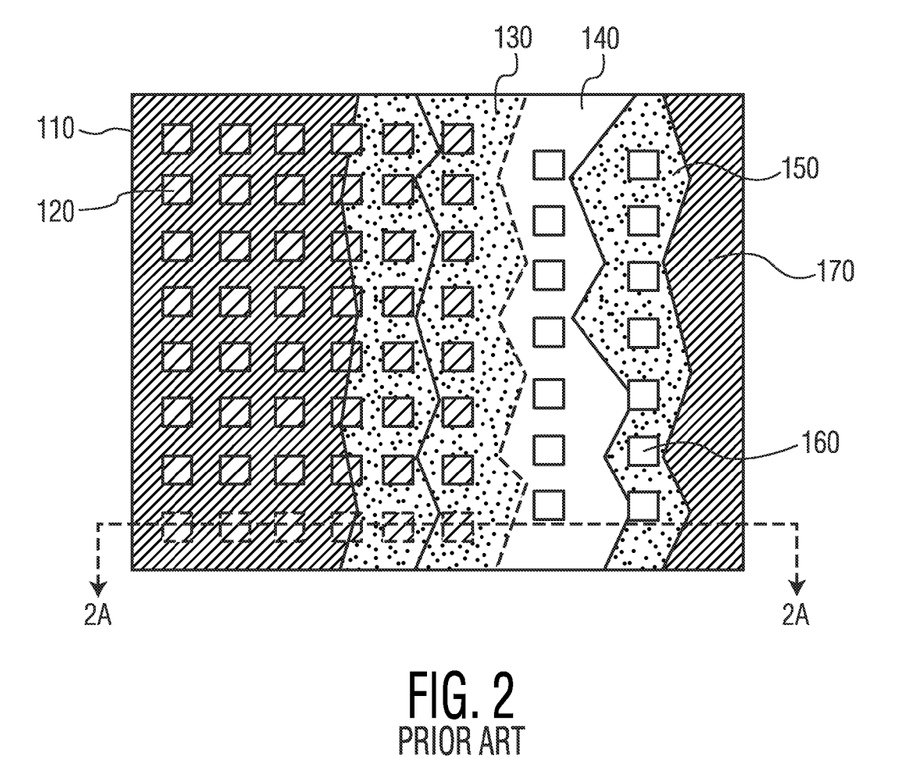
FIG. 2 (Prior Art) depicts an example conventional bonding structure having three metallization layers.
Figure 2A:
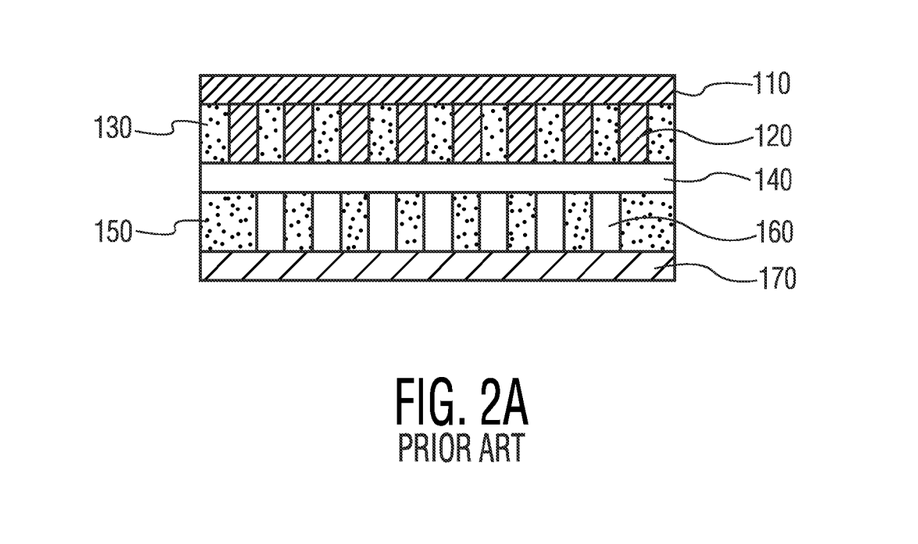

The bond pad structure may be one depicted in FIG. 2. In an example three metal level system, upon a first metallization 170, a dielectric layer 150 is defined with a via array 160. Such dielectric may include, but is not limited to, silicon oxide, silicon nitride, silicon oxy-nitride, or other organic silicon compounds. Metallization 140 may be deposited in these vias 160 and a layer formed thereon. Upon this conductive layer 140, additional dielectric material 130 may be deposited with a via array 120 staggered slightly with respect to the via array 160. Generally, it is desirable to avoid stacked vias in multilevel metal systems. Metallization 110 is deposited in the via array 120 and a layer is formed thereon. As required (not illustrated), a passivation may be used to cover exposed metal in the bond pad 100 to protect the pad and ultimately, the device from moisture and other contamination. These arrays of vias and the bonding of the metallization at multiple points have been shown to increase the strength and resilience of the bonding pad and any wire bonded to it.

There is a need to a technique to enhance the strength and resilience of the bonding pad structure so that wire attached to it may have more adhesion, thereby reducing the likelihood of broken wire bonds.

This invention has been found useful for increasing the strength and resilience of bonding pads on an integrated circuit device. Carbon nanotubes are used in place of standard metallization in the construction of the bonding pad. In an example embodiment there is, a bond pad structure on an integrated circuit (IC) substrate, the bond pad structure comprises, a first conductive layer having a top surface and a bottom surface, the bottom surface contacting the IC substrate. A dielectric layer is deposited on the top surface of the first conductive layer, the dielectric layer having an array of vias, the array of vias filled with a carbon nanotube material, the carbon nanotube material is electrically coupled to the first conductive layer. There is a second conductive layer having a top surface and a bottom surface, the bottom surface of the second conductive layer is electrically coupled to the carbon nanotube material. A feature of this embodiment includes the first or second conductive layer comprising a carbon nanotube material.

In another example embodiment, there is, a bond pad structure on an integrated circuit (IC) substrate, the bond pad structure comprises, a first conductive layer having a top surface and a bottom surface, the bottom surface contacting the IC substrate. A dielectric layer is deposited on the top surface of the first conductive layer, the dielectric layer having an array of vias, the array of vias filled with a carbon nanotube material, the carbon nanotube material is electrically coupled to the first conductive layer. There is a subsequent conductive layer having a top surface and a bottom surface, the bottom surface of the subsequent conductive layer is electrically coupled to the carbon nanotube material.

In yet another example embodiment, there is, a bond pad structure on an integrated circuit (IC) substrate, the bond pad structure comprises, a first conductive layer having a top surface and a bottom surface, the bottom surface contacting the IC substrate. At a predetermined crystal orientation, a carbon nanotube layer is deposited on the top surface of the first conductive layer. The carbon nanotube layer has an array of vias, the array of vias are filled with an interface material; the carbon nanotube material is electrically coupled to the first conductive layer. A subsequent conductive layer having a top surface and a bottom surface, is electrically coupled to the carbon nanotube material. A feature of this embodiment is that the interface material may include materials selected from the following: dielectrics, metallization, and heavily-doped silicon. Furthermore, dielectrics may include silicon dioxide, silicon-rich oxide, silicon-oxynitride, silicon nitride, methyl silsequioxane (MSQ) and hydrogen silsequioxane (HSQ). In addition, the interface material, may include the first conductive layer, the second conductive layer, aluminum, aluminum, and copper, and copper alloys. The predetermined crystalline orientation of the carbon nanotube layer may either be vertical or horizontal.

In yet another embodiment, there is a method of manufacturing an integrated circuit (IC) having a carbon nanotube structure within the bonding pads on an IC substrate. The method comprises, defining a first conductive layer on the IC, the conductive layer has a top surface and a bottom surface; the bottom surface contacts the IC substrate. On the dielectric layer, via regions are defined. In the via regions, carbon nanotubes are formed; the carbon nanotubes electrically couple to the first conductive layer. A subsequent conductive layer is has a top surface and a bottom surface; the bottom surface of the subsequent conductive layer electrically couples to the carbon nanotubes. A feature of this embodiment includes the first conductive layer and the second conductive layer comprising metallization.

In yet another embodiment, there is a method of manufacturing an integrated circuit (IC) having a carbon nanotube structure within the bonding pads on the IC substrate. The method comprises defining a first conductive layer on the IC, the conductive layer having a top surface and a bottom surface; the bottom surface contacts the IC substrate. On the top surface of the first conductive layer, an interface layer is deposited. Via regions are defined on the interface layer. In the via regions, carbon nanotubes are formed; the carbon nanotubes electrically couple to the first conductive layer. A subsequent conductive layer having a top surface and a bottom surface is defined; the bottom surface of the subsequent conductive layer electrically couples to the carbon nanotubes. A feature of this embodiment includes the interface layer may be deposited from at least one of the following materials: dielectrics, metal, and metal alloys, and heavily-doped silicon. Furthermore, the dielectrics may be selected from the following: silicon dioxide, silicon-rich oxide, silicon-oxynitride, and silicon nitride, methyl silsequioxane (MSQ), and hydrogen silsequioxane (HSQ).

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

The present invention has been found to be useful in strengthening the adhesion of a wire bond to the bond pad on a semiconductor substrate. In place of metallization in the bond pad structure, carbon nanotubes are used. For example, the metallization fill of the vias is replaced with carbon nanotubes. The high strength of the carbon nanotubes, a modulus of elasticity about 1000 G Pa versus aluminum's modulus of about 69 G Pa. Furthermore, the tensile strength of carbon nanotubes is about 170 M Pa versus aluminum's 124 M Pa. Electrically, the carbon nanotubes provide sufficient conductivity to electrically couple the multiple metal layers of the bond pad.

Figure 3A:
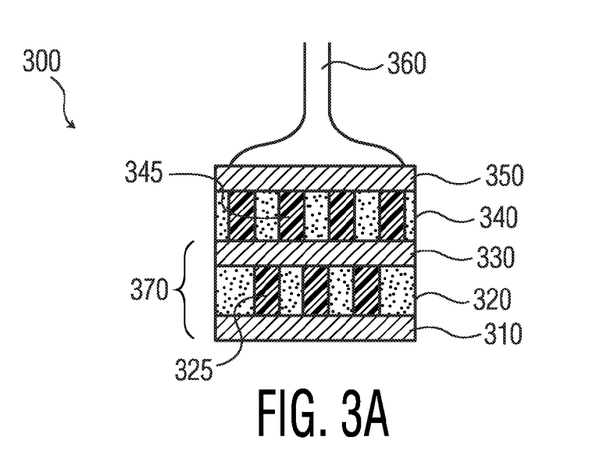
FIGS. 3A-3C depict example embodiments of a bonding pad structure according to the present invention.

In an example embodiment according to the present invention, the vias normally filled with metal, are filled with carbon nano tube material. Refer to FIG. 3A. Bond pad 300 has three layers of metallization 310, 330, 350. Sandwiched between these metallization layers 310, 330, 350, inter-level dielectric layers 320, 340. Within these inter-level dielectric layers 320, 340 are via arrays 325, 345. These via arrays are filled with carbon nano-tube material. Upon the topmost metal layer 350, a wire bond 360 is attached. Note that the number of metal layers is not necessarily restricted to three layers. A carbon nanotube structure 370 may be thought of as a composite of a conductive layer 310, nanotube material 325, inter-level dielectric 320. Modern integrated circuit devices may have four, five, six, or more layers. Consequently, the bonding pad may be constructed with a carbon nanotube structure 370 in each inter-level dielectric via array as required for a given process. A CVD process may be used to fill the vias 325, 345 with the carbon nano tube material. In an example embodiment, the crystal orientation (i.e., the direction at which the carbon nanotube material grows during crystallization) of the carbon nano tube material may be oriented in either a vertical or horizontal direction, depending upon the process requirements. In another example embodiment, a portion of the nano tube material may be oriented vertically while another portion is oriented horizontally.

Dielectric material may include, but not be limited to, silicon oxide, silicon oxynitride, or silicon nitride, or silicon-rich oxide, for example. Other dielectrics may include organic silicon compounds. These may include spin-on dielectrics such as methyl silsesquioxane (MSQ) and hydrogen silsesquioxane (HSQ). The particular requirements for a given process would determine the most suitable dielectric.

Figure 3B:
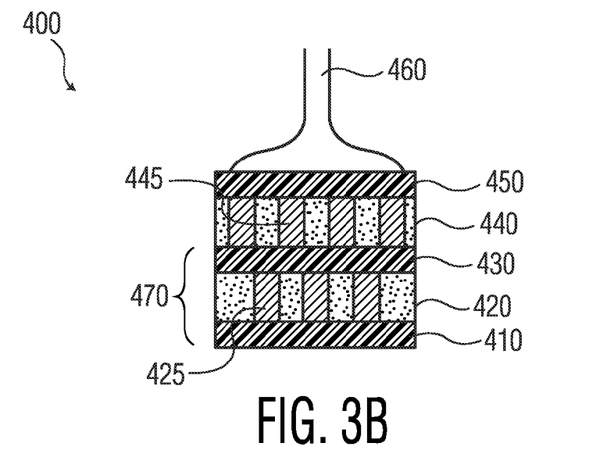

In another example embodiment, bond pad 400 has three layers of carbon nanotubes 410, 430, 450, substituting for standard metallization of FIG. 3A. Refer to FIG. 3B. Sandwiched between these carbon nanotube layers 410, 430, 450, are inter-level dielectric layers 420, 440. Within these inter-level dielectric layers 420, 440 are via arrays 425, 445. These via arrays are filled with standard metallization. Upon the topmost nanotube layer 450, substituting for metallization, a wire bond 460 is attached. The carbon nanotube structure 470 (as is the case in FIG. 3A) may be thought of as a composite of a conductive layer 410, nanotube material 425, and inter-level dielectric 420.

Figure 3C:
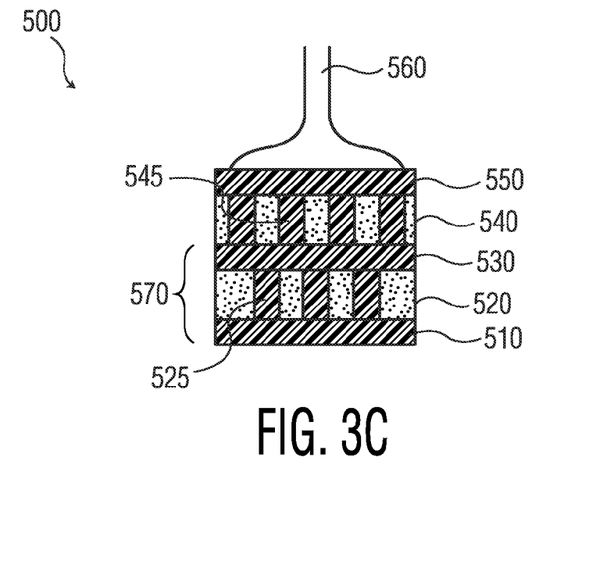

In another example embodiment, bond pad 500 has three layers of carbon nanotubes 510, 530, 530, substituting for standard metallization of FIG. 3A. Refer to FIG. 3C. Sandwiched between these carbon nanotube layers 510, 530, 550, are inter-level dielectric layers 520, 540. Within these inter-level dielectric layers 520, 540 are via arrays 525, 545. These via arrays are filled with carbon nanotube material, as well. Thus, the metallization of the bond pad 500 has been replaced with carbon nanotube material. Upon the topmost carbon nanotube layer 550, a wire bond 560 is attached. The carbon nanotube structure 570 may be thought of as a composite of a first layer of nanotube material 510, nanotube material 525, and inter-level dielectric 520.

The use of carbon nanotubes may be implemented in the processing of the metallization steps of the integrated circuit devices. For example, in filling the vias with carbon nanotube material, a chemical vapor deposition (CVD) process may be used. Such a process would be intermeshed with the standard integrated device processing. Background information may be found in Haase, US Patent Application Publication (US 2003/0211724 A1) of Nov. 13, 2003 titled, "Providing Electrical Conductivity Between and Active Region and an Conductive Layer in a Semiconductor Device Using Carbon Nanotubes," and is incorporated by reference in its entirety.

Figure 4:
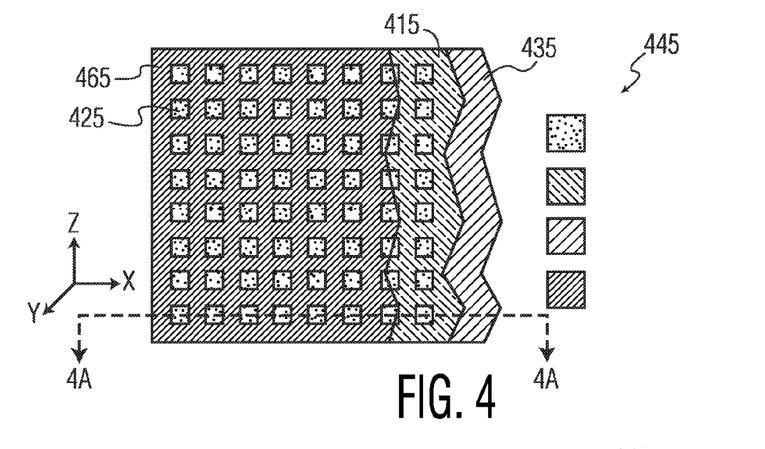
FIG. 4A depicts an example embodiment of a bond pad structure in top view and side view with nanotubes oriented in a vertical direction surrounded by dielectric.
FIG. 4B depicts an example embodiment of a bond pad structure in side with nanotubes oriented in a vertical direction surrounded by a conductive material.
Figure 4A:
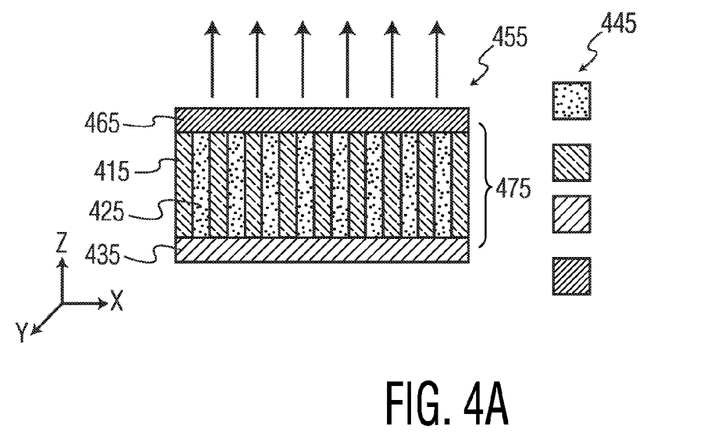

Refer to FIG. 4A. In an example embodiment, a bonding pad includes three layers. The first layer is a conductive material 435. The conductive material may be aluminum or its alloys, or copper and its alloys, but is not only limited to these metals. Other conductive materials may include polysilicon materials doped sufficiently to make the silicon conductive. Upon the first layer 435, a dielectric layer 415 may be deposited. Contact holes or vias 425 may be defined in this dielectric layer 415. The depth of the vias 425 is such that there is access to the conductive material 435. Nanotube material 445 is formed within these vias 425. In the present example, the nanotube material may be formed through chemical vapor deposition (CVD). Other techniques include plasma enhanced chemical vapor deposition (PECVD). Depending upon the processing parameters involved, the crystal orientation of the nanotube material 445 may be vertical or horizontal. Coupling to the nanotube material 445, may be a second or subsequent conductive material 465. The carbon nanotube structure 475 (including layers 435, 425, 415, 465) may be repeated depending upon the number of metal layers used in a given process technology.

Figure 4B:
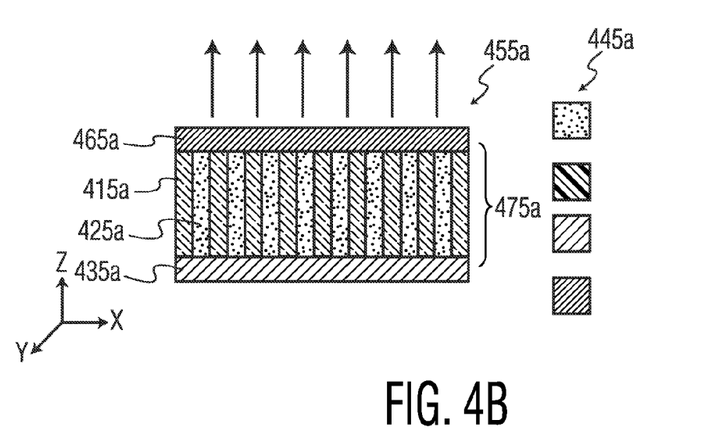

Refer to 4B. In a modification of the embodiment of FIG. 4A. The first layer is a conductive material 435a. Upon the first conductive layer 435a, a second conductive layer 415a may be deposited in place of the dielectric layer 415. Vias 425a may be defined in this dielectric layer 415. The depth of the vias 425a is such that there is access to the conductive material 435a. Nanotube material 445a is formed within these vias 425a. Thus, the nanotube material 445a is surrounded with a second conductive layer 415a. The second conductive layer 415a may be a metallization like the first conductive layer 435a. Coupling to the nanotube material 445, may be a second or subsequent conductive material 465a. The carbon nanotube structure 475a (including layers 435a, 425a, 415a, 465a) may be repeated depending upon the number of metal layers used in a given process technology.

The carbon nanotubes may be oriented in a number of directions with respect to the silicon substrate at the bond pad. In the aforementioned example bond pad structures in which an upward vertical force 455, 455a is applied there is about 36% less mean normal stress for a complete field of nanotubes versus aluminum. For a vertical composite of 50% aluminum and 50% nanotubes, the mean normal stress 455a is 46% less than aluminum alone. Also, for a vertical composite of 50% SiO2 and 50% nanotubes, the mean normal stress 455 is 46% less than aluminum alone.

Figure 5:
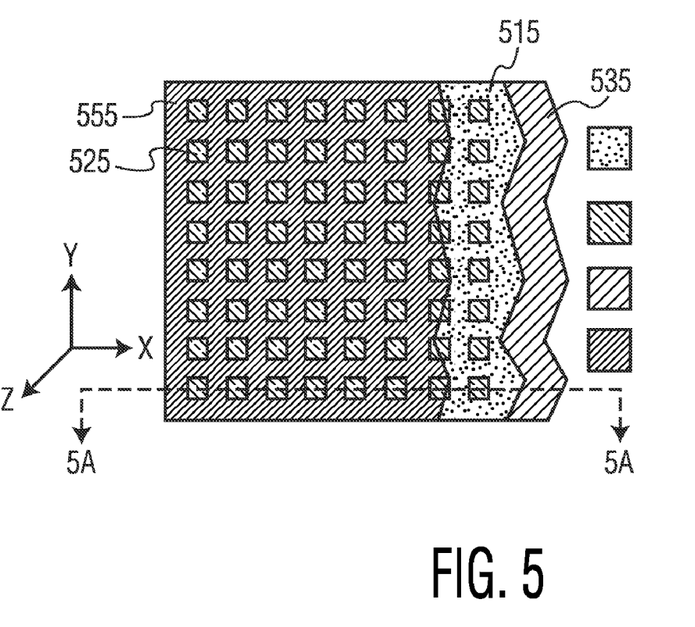
FIG. 5 depicts an example embodiment of a bond pad structure in top view and side view with dielectric material surrounded by nanotubes oriented in a horizontal direction.
Figure 5A:
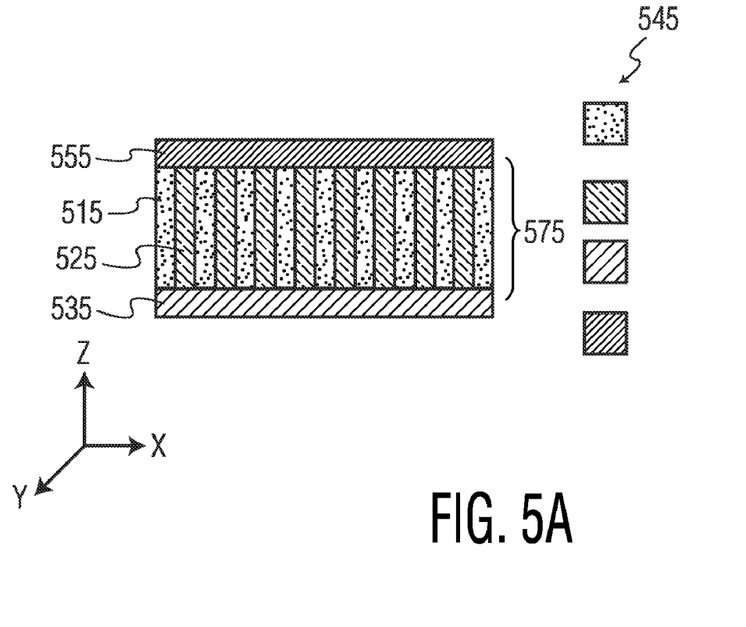

Refer to FIG. 5. In another example embodiment, upon a conductive material 535, nanotube material 515 is deposited so that their crystal orientation is horizontal. On this nanotube material 515, vias 525 are defined. Dielectric material 525 is deposited in the vias 525. In a variation of the structure of FIG. 5, conductive material may be deposited within the vias in place of dielectric material 525. Coupling to the nanotube material 515, may be a second or subsequent conductive material 555. The carbon nanotube structure 575 (including layers 515, 525, 535, 555) may be repeated depending upon the number of metal layers used in a given process technology.

Figure 6:
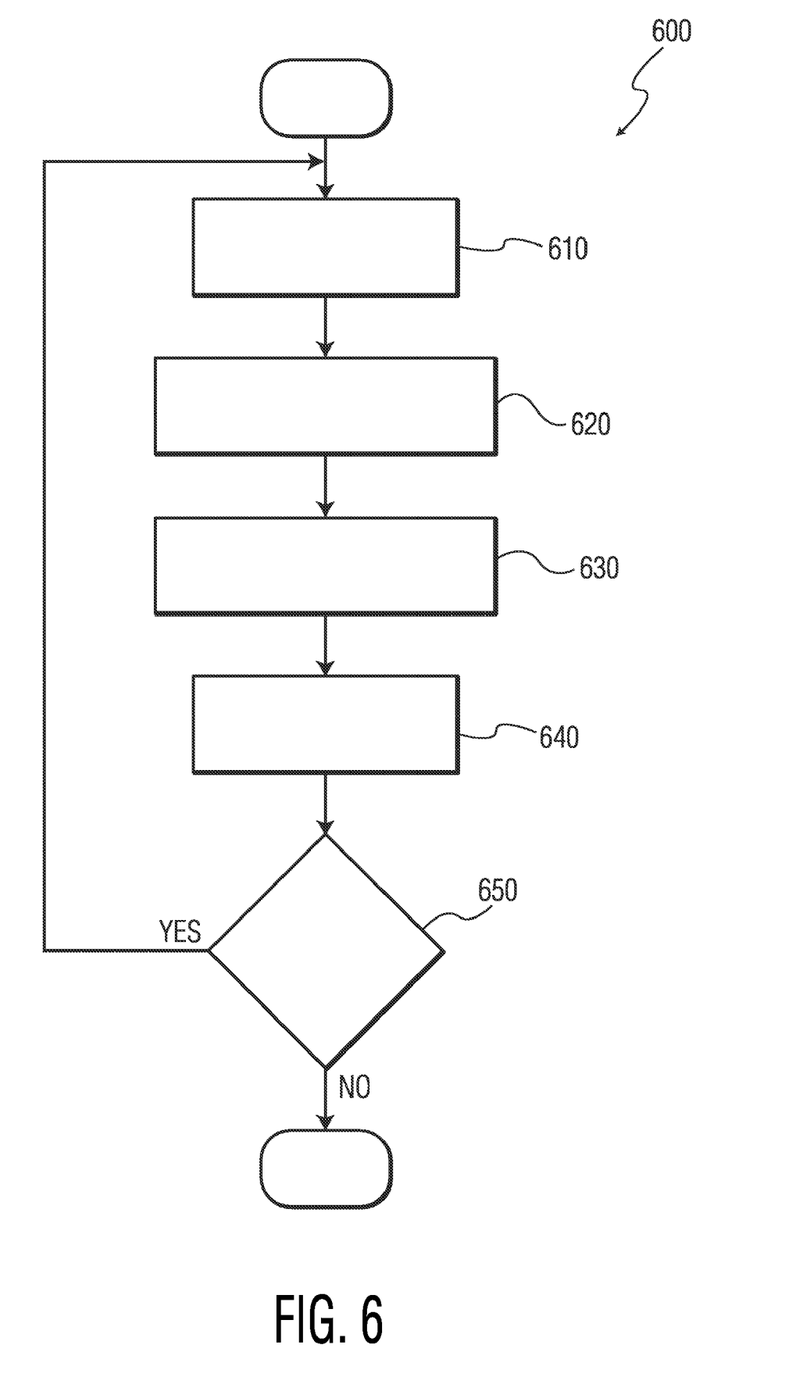
FIG. 6 is a flowchart of the steps to build a bond pad incorporating nanotubes according an embodiment of the present invention.

In applying the invention as described in the example embodiments, an example process outlined in FIG. 6 may be used. During IC device fabrication, the addition of nanotube material may be incorporated. In a process 600, a conductive layer on the IC device is defined on the bond pads 610. Upon the conductive layer 610, a dielectric layer 620 is formed. Via regions are defined on the dielectric layer 630 to provide electrical connection from the conductive layer 610 to subsequent conductive layers. Nanotubes are formed in via regions 640. If desired, another nanotube/dielectric/conductive layer structure 650 may be defined. The number of these structures is determined by how may metal layers are in a given IC device design. These may range from two, three, four, or more metal layers.

Figure 7:
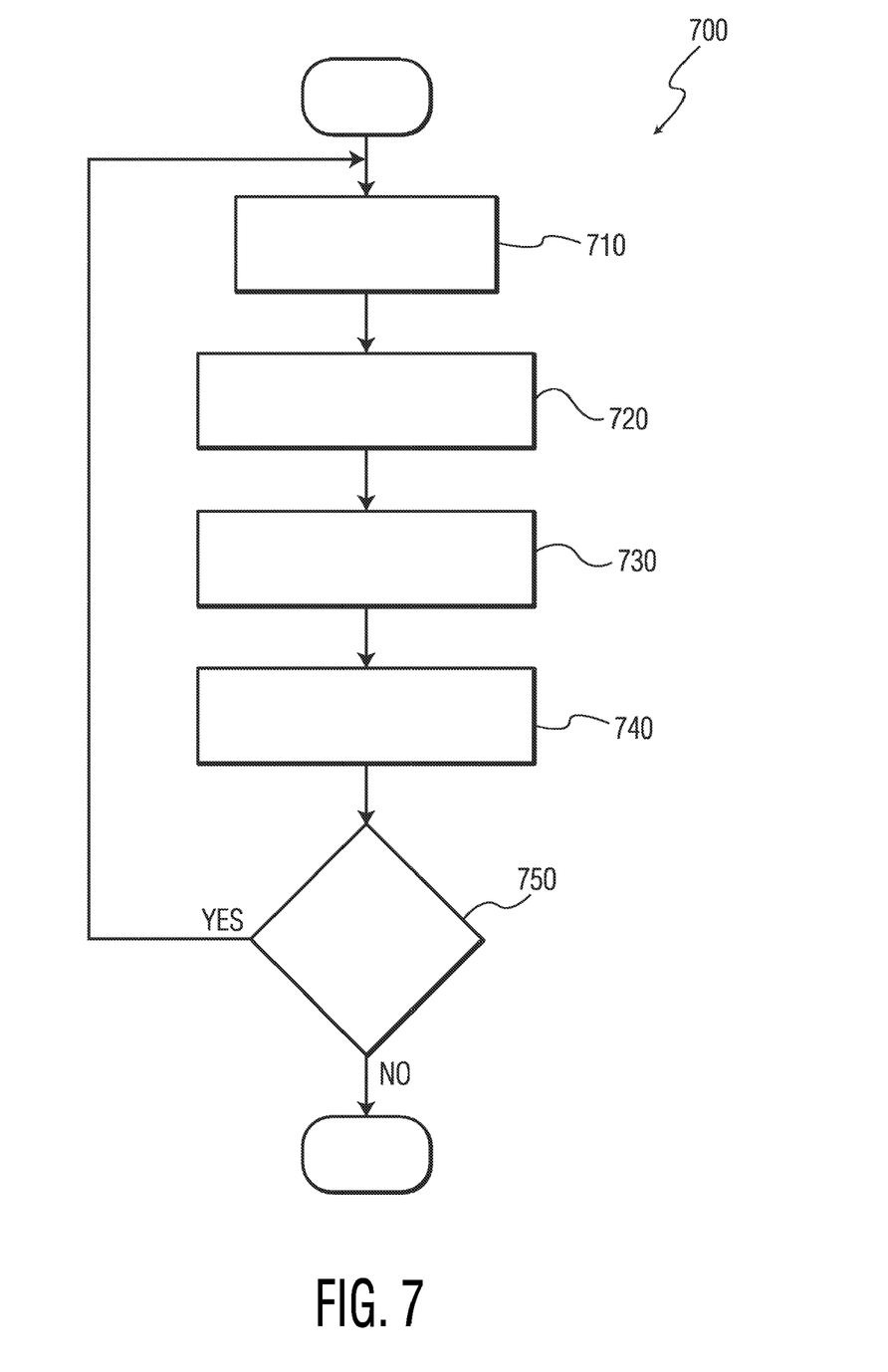
FIG. 7 is a flowchart of the steps to build a bond pad incorporating nanotubes according to an embodiment of the present invention.

Refer to FIG. 7. In another example process 700, a conductive layer is defined 710. Upon the conductive layer 710, a nanotube layer 720 is defined. Upon the nanotube layer 720, nanotube via regions 730 are defined. Dielectric is then deposited in the nanotube via regions 740. If desired, additional structures 750 may be formed. In a variation of this example process, instead of depositing dielectric in the nanotube via regions 740, conductive material, usually metallization may be used.

While the present invention has been described with reference to several particular example embodiments, those skilled in the art will recognize that many changes may be made thereto without departing from the spirit and scope of the present invention, which is set forth in the following claims.

What is claimed is:

1. A bond pad structure on an integrated circuit (IC) substrate, the bond pad structure comprising:
   a first conductive layer having a top surface and a bottom surface, the bottom surface attached contacting to the IC substrate;
   a dielectric layer deposited on the top surface of the first conductive layer, the dielectric layer having an array of vias, each of the array of vias filled with a carbon nanotube material, the carbon nanotube material contacting and electrically coupled to the first conductive layer; and
   a second conductive layer having a top surface and a bottom surface, the bottom surface of the second conductive layer contacting and electrically coupled to the carbon nanotube material;
   wherein, the carbon nanotube material provides a continuous electrical connection between the first and second conductive layers and wherein the first conductive layer or the second conductive layer comprises a carbon nanotube material.

2. The bond pad structure as recited in claim 1, wherein the first conductive layer is metallization.

3. The bond pad structure as recited in claim 1, wherein the second conductive layer is metallization.

4. The bond pad structure as recited in claim 1, wherein the carbon nanotube material contacts the top surface of the first conductive layer, but does not extend through the first conductive layer.

5. The bond pad structure as recited in claim 4, wherein the carbon nanotube material contacts the bottom surface of the second conductive layer, but does not extend through the second conductive layer.

6. The bond pad structure as recited in claim 1, wherein the second conductive layer provides a single bond pad, and where the carbon nanotube material in the array of vias directly supports the bond pad.

7. A bond pad structure on an integrated circuit (IC) substrate, the bond pad structure comprising:
   a first conductive layer having a top surface and a bottom surface, the bottom surface contacting the IC substrate;
   a carbon nanotube layer deposited at predetermined crystal orientation on the top surface of the first conductive layer, the carbon nanotube layer having an array of vias, the array of vias filled with an interface material, the carbon nanotube layer electrically coupled to the first conductive layer; and
   a subsequent conductive layer having a top surface and a bottom surface, the bottom surface of the subsequent conductive layer electrically coupled to the carbon nanotube material layer and wherein the first conductive layer or the subsequent conductive layer comprises a carbon nanotube material.

8. The bond pad structure as recited in claim 7, wherein the first conductive layer and the subsequent conductive layer include metallization.

9. The bond pad structure as recited in claim 7, wherein the interface material includes at least one selected from the following: dielectrics, metallization, and heavily-doped silicon.

10. The bond pad structure as recited in claim 9, wherein the interface material includes at least one of the following: the first conductive material, the second conductive material, aluminum, aluminum alloys, copper, and copper alloys.

11. The bond pad structure as recited in claim 7, wherein the interface material includes one or more of the following: silicon dioxide, silicon-rich oxide, silicon-oxynitride, and silicon nitride, methyl silsequioxane, and hydrogen silsequioxane.

12. The bond pad structure as recited in claim 7, wherein the predetermined crystalline orientation of the carbon nanotube layer is selected from the following: horizontal, vertical.

* * * * *